(12) United States Patent
Saloio, Jr. et al.

(10) Patent No.: US 9,912,310 B2
(45) Date of Patent: Mar. 6, 2018

(54) DIFFERENTIAL SIGNAL CONDITIONER WITH COMMON MODE VOLTAGE ERROR COMPENSATION

(71) Applicant: Hamilton Sundstrand Corporation, Charlotte, NC (US)

(72) Inventors: James Saloio, Jr., Ludlow, MA (US); Robert D. Klapatch, Wethersfield, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 15/212,473

(22) Filed: Jul. 18, 2016

(65) Prior Publication Data

US 2018/0019718 A1    Jan. 18, 2018

(51) Int. Cl.
*H03F 3/45*    (2006.01)
*H03G 3/30*    (2006.01)

(52) U.S. Cl.
CPC .......... *H03F 3/45479* (2013.01); *H03G 3/30* (2013.01); *H03F 2200/471* (2013.01); *H03F 2203/45212* (2013.01)

(58) Field of Classification Search
CPC ......... H03F 1/02; H03F 3/45; H03F 2200/375
USPC ...................... 330/9, 69, 258, 259
See application file for complete search history.

(56) References Cited

U.S. PATENT DOCUMENTS

| | | | |
|---|---|---|---|
| 7,365,600 B1 * | 4/2008 | Lokere | H03F 3/45085 330/258 |
| 7,800,449 B2 | 9/2010 | Mulder et al. | |
| 7,817,070 B2 | 10/2010 | Games | |
| 7,863,977 B1 * | 1/2011 | Xiang | A61B 5/0428 330/124 R |
| 8,272,246 B2 | 9/2012 | Andarawis et al. | |
| 8,884,699 B2 | 11/2014 | Casiraghi et al. | |
| 9,136,808 B2 | 9/2015 | Kim | |
| 9,160,323 B2 | 10/2015 | Yoo | |
| 9,209,789 B1 | 12/2015 | Li et al. | |

(Continued)

FOREIGN PATENT DOCUMENTS

WO    2015044485 A1    4/2015

OTHER PUBLICATIONS

European Search Report for Application No. 17181844.6-1805 dated Nov. 28, 2017, 34 pages.

*Primary Examiner* — Steven J Mottola
(74) *Attorney, Agent, or Firm* — Cantor Colburn LLP

(57) ABSTRACT

A differential signal conditioner circuit with common mode voltage (CMV) compensation is provided. The circuit includes a signal multiplexer that receives a input signal that includes a high and low signal and a reference CMV signal, a differential amplifier coupled to the signal multiplexer that receives the reference CMV signal and outputs a CMV error value during a first cycle, and receives the input signal and outputs an amplified difference signal during a second cycle. The circuit also includes a CMV measurement circuit that receives the reference CMV signal and outputs a confirmation value during the first cycle, and receives the input signal and outputs a CMV compensation value during the second cycle, and a processing element that receives the CMV error value, the amplified difference signal, the CMV compensation value, and a differential amplifier gain value and generates a CMV compensated output based on the received signals and values.

20 Claims, 5 Drawing Sheets

(56) References Cited

U.S. PATENT DOCUMENTS

| | | |
|---|---|---|
| 9,322,732 B2 | 4/2016 | Marrota et al. |
| 9,391,630 B2 | 7/2016 | Saloio et al. |
| 2007/0132625 A1 | 6/2007 | Chen |
| 2015/0214911 A1 | 7/2015 | Johnson et al. |
| 2016/0065317 A1* | 3/2016 | Candage .................. H03F 1/26 375/285 |

* cited by examiner

DIFFERENTIAL SIGNAL CONDITIONER WITH COMMON MODE VOLTAGE ERROR COMPENSATION

BACKGROUND

The subject matter disclosed herein generally relates to a differential signal conditioner and, more particularly, to error compensation in a differential signal conditioner.

As shown in FIG. 1, a general differential input signal conditioner 100 includes input signals 104, compensation signals 106, a signal mux 108 selects from amount the signals 104, 106, a difference amplifier 102, an A/D mux 110, an A/D converter 112, and a digital system/processor 114 that provides selection signals and control signals as shown.

General differential input signal conditioners, such as the differential input signal conditioner 100, amplifies the differential input signal, SIG1, and is generally not able to completely reject a common mode voltage signal, SIG1_CMV. The difference amplifier 103 in the general/legacy differential input signal conditioner 100 diagram shown in FIG. 1 is used to amplify the input signal and attempts to reject its common mode voltage. However, as noted above, a real world difference amplifier is non-ideal and produces an error voltage due to the common mode voltage.

The resulting common mode voltage error term can be described using a common mode rejection ratio (CMRR) that is the ratio of the common-mode gain to differential-mode gain. However, the CMRR of an amplifier varies with input signals, temperature, and from device to device and the input signal DC common mode voltage is typically unknown.

For example, in the case of a thermocouple signal, the CMRR error term could be very significant because it only takes approximately 41 micro-volts of CMRR error to cause a 1 degree Celsius temperature error. The CMRR error term on a strain gauge signal is also significant because strain gauge sensors have a nominal non-zero common mode input voltage. For example, a strain gauge sensor with a 10V excitation typically produces a nominal 5V DC common mode output voltage.

Therefore, the CMRR error term can be a significant error in systems that require high accuracy. However, in most legacy differential input signal conditioners, it is not possible to compensate for the CMRR error term, especially if the common mode input voltage is unknown or varies over a wide range.

BRIEF DESCRIPTION

According to one embodiment a differential signal conditioner circuit with common mode voltage (CMV) compensation is provided. The differential signal conditioner circuit includes a signal multiplexer that receives a differential input signal that includes a high signal and a low signal and a reference CMV signal, a differential amplifier coupled to the signal multiplexer that receives the reference CMV signal from the signal multiplexer and outputs a CMV error value during a first cycle, and receives the differential input signal from the signal multiplexer and outputs an amplified difference signal during a second cycle. The differential signal conditioner circuit also includes a CMV measurement circuit that receives the reference CMV signal from the signal multiplexer and outputs a confirmation value during the first cycle, and receives the differential input signal from the signal multiplexer and outputs a CMV compensation value during the second cycle, and a processing element that receives the CMV error value, the amplified difference signal, the CMV compensation value, and a differential amplifier gain value and generates a CMV compensated output based on the CMV error value, the amplified difference signal, the CMV compensation value, and the differential amplifier gain value.

In addition to one or more of the features described above, or as an alternative, further embodiments may include, wherein the processing element generates the CMV compensated output by dividing the CMV error value by the differential amplifier gain value to produce a regulated CMV error value, multiplying the CMV compensation value with the regulated CMV error value to produce a compensation factor, and adding the compensation factor to the amplified difference signal to produce the CMV compensated output.

In addition to one or more of the features described above, or as an alternative, further embodiments may include, wherein the CMV measurement circuit generates the CMV compensation value by averaging the high signal and the low signal of the differential input signal.

In addition to one or more of the features described above, or as an alternative, further embodiments may include, wherein the processing element includes an A/D multiplexer that receives the amplified difference signal from the difference amplifier and the CMV compensation signal from the CMV measurement circuit, and a digital system processor that selects, combines, and outputs one or more of the CMV error value, the amplified difference signal, the CMV compensation value, and the differential amplifier gain value, and an A/D converter that generates a digital representation of the CMV compensated output.

In addition to one or more of the features described above, or as an alternative, further embodiments may include, wherein the CMV measurement circuit includes a first buffer amplifier that receives a high impedance input, a second buffer amplifier that receives a low impedance input, and a value averaging circuit that averages the outputs from first buffer amplifier and the second buffer amplifier generating a compensation value.

In addition to one or more of the features described above, or as an alternative, further embodiments may include, wherein the compensation value is the CMV compensation value when the received high impedance input and low impedance input are portions of the differential input signal.

In addition to one or more of the features described above, or as an alternative, further embodiments may include, wherein the compensation value is the confirmation value when the received high impedance input and low impedance input are portions the reference CMV.

In addition to one or more of the features described above, or as an alternative, further embodiments may include, wherein the signal multiplexer receives a gain compensation signal and an offset compensation signal, wherein the gain compensation signal corrects for a gain error present in the difference amplifier, and wherein the offset compensation signal corrects for an offset error present in the difference amplifier.

In addition to one or more of the features described above, or as an alternative, further embodiments may include, wherein the signal multiplexer receives a plurality of differential input signals.

According to another embodiment, a method for providing differential signal conditioning with common mode voltage compensation is provided. The method including receiving, at a differential amplifier during a first cycle, the reference CMV signal and outputting a CMV error value, receiving, at a CMV measurement circuit during the first cycle, the reference CMV signal from the signal multiplexer and output a confirmation value, receiving, at the differential amplifier during a second cycle, the differential input signal and outputting an amplified difference signal, receiving, at the CMV measurement circuit during the second cycle, the differential input signal from the signal multiplexer and output a CMV compensation value, receiving, at a processing element, the CMV error value, the amplified difference signal, the CMV compensation value, and a differential amplifier gain value, and generating a CMV compensated output based on the CMV error value, the amplified difference signal, the CMV compensation value, and the differential amplifier gain value.

In addition to one or more of the features described above, or as an alternative, further embodiments may include receiving the differential input signal that includes a high signal and a low signal and the reference CMV signal at a signal multiplexer, and transmitting one of the differential input and the reference CMV to the differential amplifier and the CMV measurement circuit based on a received selection signal from the processing element.

In addition to one or more of the features described above, or as an alternative, further embodiments may include, wherein generating the CMV compensated output includes dividing the CMV error value by the differential amplifier gain value to produce a regulated CMV error value, multiplying the CMV compensation value with the regulated CMV error value to produce a compensation factor, and adding the compensation factor to the amplified difference signal to produce the CMV compensated output.

In addition to one or more of the features described above, or as an alternative, further embodiments may include generating the CMV compensation value by averaging the high signal and the low signal of the differential input signal.

In addition to one or more of the features described above, or as an alternative, further embodiments may include receiving, at an A/D multiplexer, the amplified difference signal from the difference amplifier and the CMV compensation signal from the CMV measurement circuit, selecting, combining, and outputting one or more of the CMV error value, the amplified difference signal, the CMV compensation value, and the differential amplifier gain value using a digital system processor, and generating, sing an A/D converter, a digital representation of the CMV compensated output.

In addition to one or more of the features described above, or as an alternative, further embodiments may include receiving, at a first buffer amplifier, a high impedance input, receiving, at a second buffer amplifier, a low impedance input, and averaging, using a value averaging circuit, the outputs from first buffer amplifier and the second buffer amplifier generating a compensation value.

In addition to one or more of the features described above, or as an alternative, further embodiments may include, receiving, at the signal multiplexer, a gain compensation signal and an offset compensation signal, correcting, using the gain compensation signal, for a gain error present in the difference amplifier, and correcting, using the offset compensation signal, for an offset error present in the difference amplifier.

In addition to one or more of the features described above, or as an alternative, further embodiments may include, receiving, at the signal multiplexer, a plurality of differential input signals.

According to another embodiment, a system for differential signal conditioning with common mode voltage compensation is provided. The system including a differential amplifier device that receives a reference CMV signal and output a CMV error value during a first cycle, and receives a differential input signal and outputs an amplified difference signal during a second cycle, a measurement device that receives the reference CMV signal and output a confirmation value during the first cycle, and receives the differential input signal, and outputs a CMV compensation value during the second cycle, and a processing element that receives the CMV error value, the amplified difference signal, the CMV compensation value, and a differential amplifier gain value, and generates a CMV compensated output based on the CMV error value, the amplified difference signal, the CMV compensation value, and the differential amplifier gain value.

In addition to one or more of the features described above, or as an alternative, further embodiments may include, wherein the processing element generates the CMV compensated output by dividing the CMV error value by the differential amplifier gain value to produce a regulated CMV error value, multiplying the CMV compensation value with the regulated CMV error value to produce a compensation factor, and adding the compensation factor to the amplified difference signal to produce the CMV compensated output.

In addition to one or more of the features described above, or as an alternative, further embodiments may include, wherein the CMV measurement device includes a first buffer amplifier that receives a high impedance input, a second buffer amplifier that receives a low impedance input, and a value averaging circuit that averages the outputs from first buffer amplifier and the second buffer amplifier generating a compensation value, wherein, during a first cycle, the compensation value is the confirmation value when the received high impedance input and low impedance input are portions the reference CMV, and wherein, during a second cycle, the compensation value is the CMV compensation value when the received high impedance input and low impedance input are portions of the differential input signal.

The foregoing features and elements may be combined in various combinations without exclusivity, unless expressly indicated otherwise. These features and elements as well as the operation thereof will become more apparent in light of the following description and the accompanying drawings. It should be understood, however, that the following description and drawings are intended to be illustrative and explanatory in nature and non-limiting.

BRIEF DESCRIPTION OF THE DRAWINGS

The foregoing and other features, and advantages of the present disclosure are apparent from the following detailed description taken in conjunction with the accompanying drawings in which.

DETAILED DESCRIPTION

Figure 1:
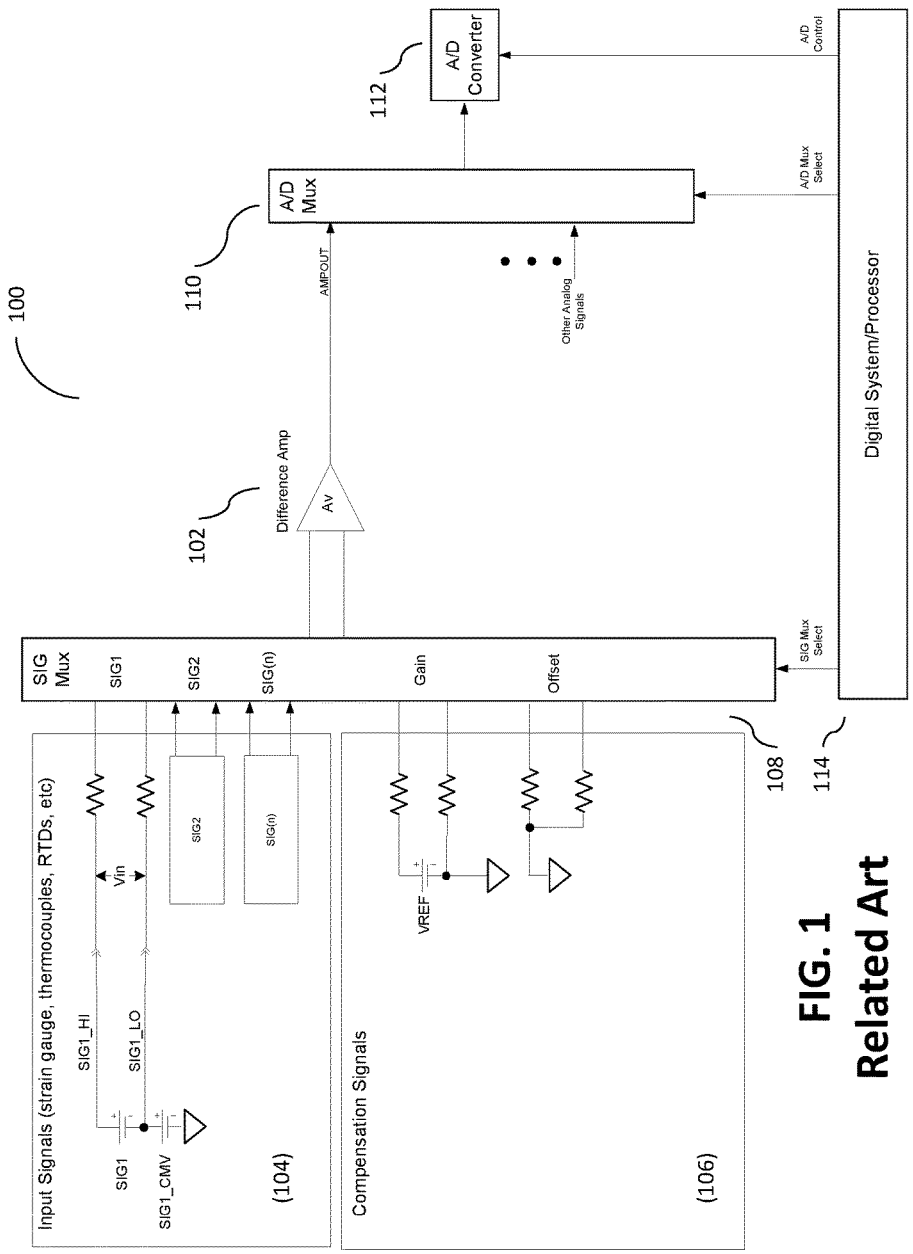
FIG. 1 depicts a general differential input signal conditioner circuit.

As shown and described herein, various features of the disclosure will be presented. Various embodiments may have the same or similar features and thus the same or similar features may be labeled with the same reference numeral, but preceded by a different first number indicating the figure to which the feature is shown. Thus, for example, element "a" that is shown in FIG. X may be labeled "Xa" and a similar feature in FIG. Z may be labeled "Za." Although similar reference numbers may be used in a generic sense, various embodiments will be described and various features may include changes, alterations, modifications, etc. as will be appreciated by those of skill in the art, whether explicitly described or otherwise would be appreciated by those of skill in the art.

Embodiments described herein are directed to a circuit, system, and/or method to compensate for common mode voltage measurement errors in a data acquisition system. For example, one or more embodiments, disclose an accurate measurement of an electronic engine control (EEC) differential sensor signal received from, for example strain gauges or thermocouples, in the presence of an unknown common mode voltage. An ideal differential input signal conditioner should amplify only the differential input signal while completely rejecting the common mode voltage signal. However, as noted above, a real world difference amplifier is non-ideal and produces an error voltage due to the common mode voltage that is nominally present on, for example, strain gauges. Accordingly one or more embodiments of the present disclosure include a system, circuit, and method of implementing an additional measurement circuit that provides an ability to measure a common mode voltage (CMV) and common mode rejection ratio (CMRR) and adjust accordingly.

A method in accordance with one or more embodiments is described as follows. Initially, the common mode error of a measurement system is measured by applying known common mode test signals as the input to the system. The resulting measured common mode errors are then used to characterize the measurement system response to the applied common mode input voltages.

Next the common mode voltage of an actual unknown input signal is measured to determine a common mode voltage. This measured input common mode voltage is used to predict the common mode voltage error of the measurement system, by using the characterization response determined above. This predicted error is then subtracted from the signal measurement to eliminate the effect of the common mode measurement error.

The embodiments disclosed herein are not limited to the number of known common mode test input voltages used to characterize the system and are not limited to the form of equations use to characterize the system due to common mode voltage. For example, compensation equations may be non-linear and signals may filtered or read multiple times to improve accuracy of compensation.

According to one or more embodiments, in a simple form, as little as two common mode input voltages may be used to characterize the system and linear interpolation may be used to predict the effects of common mode input voltage.

Figure 2:
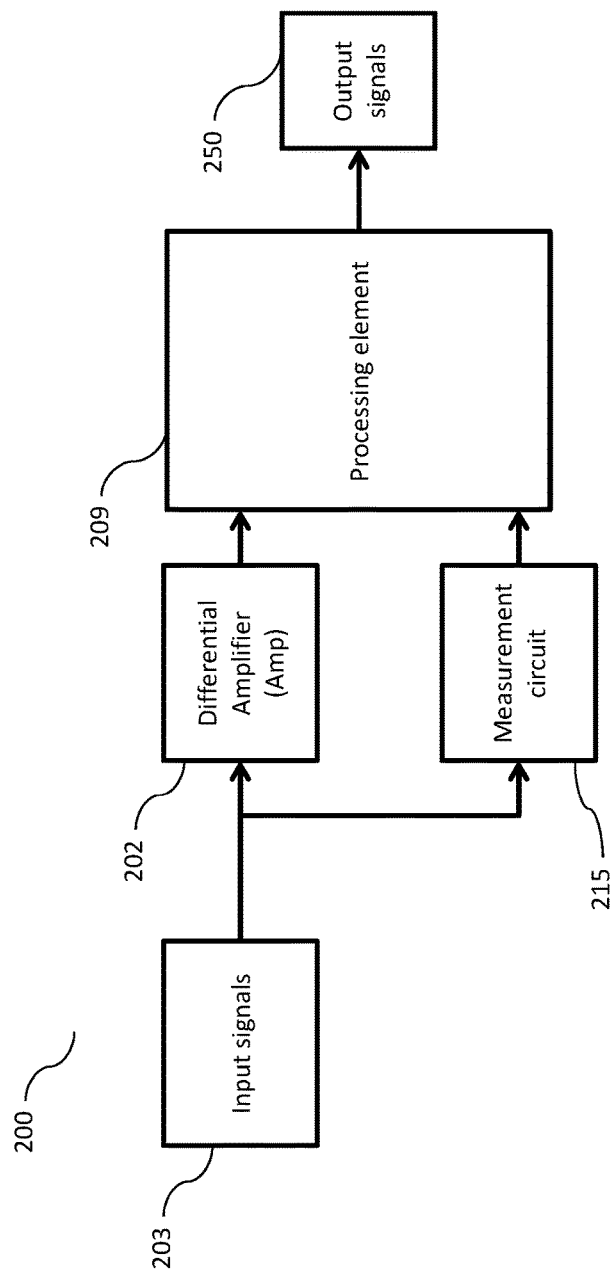
FIG. 2 depicts a block diagram of a differential input signal system in accordance with one or more embodiments of the present disclosure.

Turning now to the figures, FIG. 2 depicts a block diagram of a differential input signal system 200 in accordance with one or more embodiments of the present disclosure. The differential input signal system 200 includes input signals 203 that are provided to both a differential amplifier (Amp) 202 and a measurement circuit 215. The outputs of both the differential amplifier (Amp) 202 and the measurement circuit 215 are provided to processing element 209, which can also be called a signal selector and converter 209. The processing element 209 generates outputs signals 250 that can include a CMV compensated output based on the received outputs from the differential amplifier 202 and the measurement circuit 215. The received outputs can include one or more of a CMV error value, an amplified difference signal, a CMV compensation value, and a differential amplifier gain value.

Figure 3:
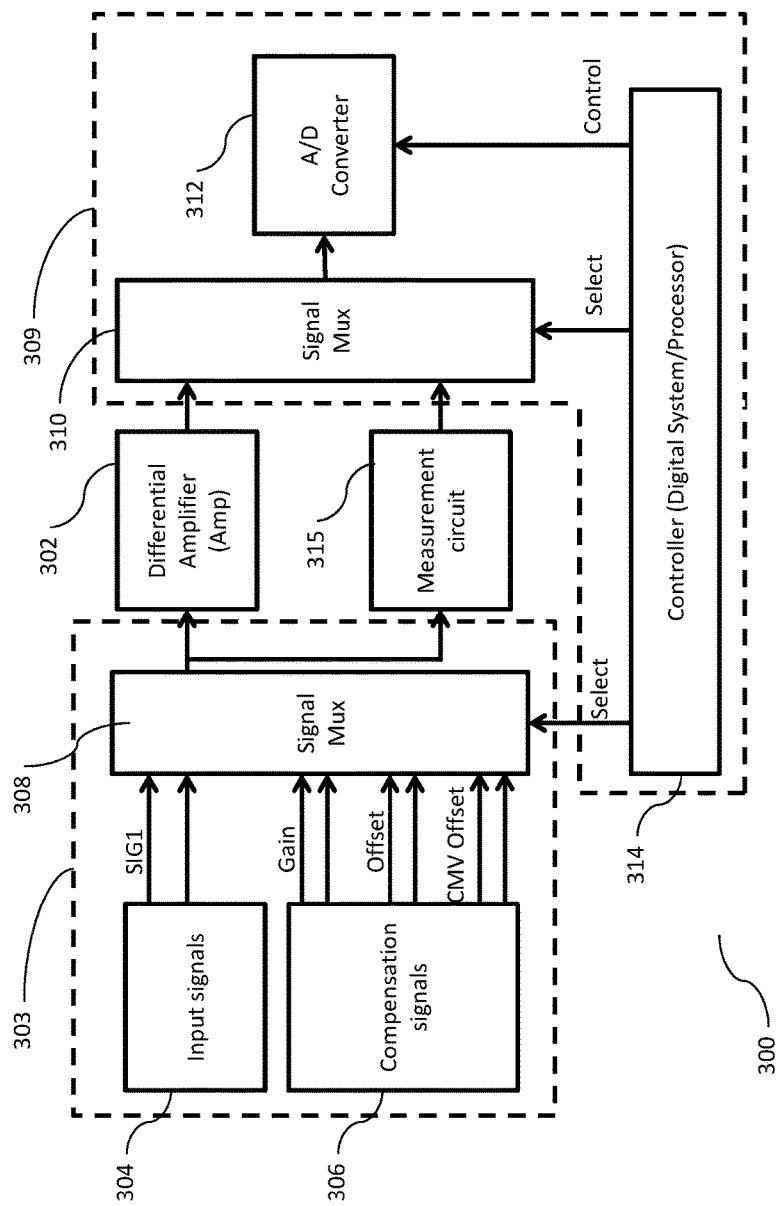
FIG. 3 depicts a block diagram of a differential input signal system in accordance with one or more embodiments of the present disclosure.

FIG. 3 depicts a block diagram of a differential input signal system 300 that includes additional elements in accordance with one or more embodiments of the present disclosure. Specifically, the differential input signal system 300 includes input signals 303 that are provided to both a differential amplifier (Amp) 302 and a measurement circuit 315. The outputs of both the differential amplifier (Amp) 302 and the measurement circuit 315 are provided to a processing element 309, which can also be called a signal selector and converter 309. The processing element 309 generates output signals that can include a CMV compensated output based on the received outputs from the differential amplifier 302 and the measurement circuit 315. The received outputs can include one or more of a CMV error value, an amplified difference signal, a CMV compensation value, and a differential amplifier gain value.

Further, the input signals 303 can include input signals 304 that include a differential input signal (SIG1). The inputs signals 303 can also include compensation signals 306. For example, compensation signals 306 can include a gain signal, an offset signal, and a CMV offset signal in accordance with one or more embodiments. As illustrated, these values are shown as differential signals. Of course, non-differential (e.g., zero-reference) signals can be provided.

A signal multiplexer 308 receives the input and compensation signals 304, 306. The multiplexer 308 is controlled by a selection signal from a controller 314. The controller 314 can be an entire digital system, a processor, or anything there between. The signal multiplexer 308 then provides a selected signal to both the differential amplifier 302 and the measurement circuit 315.

Further, after the signals pass through both elements (the differential amplifier 302 and the measurement circuit 315); the signals from each are provided to the processing element 309, which can also be called the signal selector and converter 309. Specifically, as shown the selector and converter 309 includes a signal multiplexer 310 (that selects) an analog to digital converter 312 (that converts) and a controller 314. The signals from the differential amplifier 302 and the measurement circuit 315 are provided to the signal multiplexer 310 which receives a second selection signal from the controller 314. The signal multiplexer 310 selects a signal based on the second selection signal and provides the selected signal to the A/D converter 312 which processes the signal.

Figure 4:
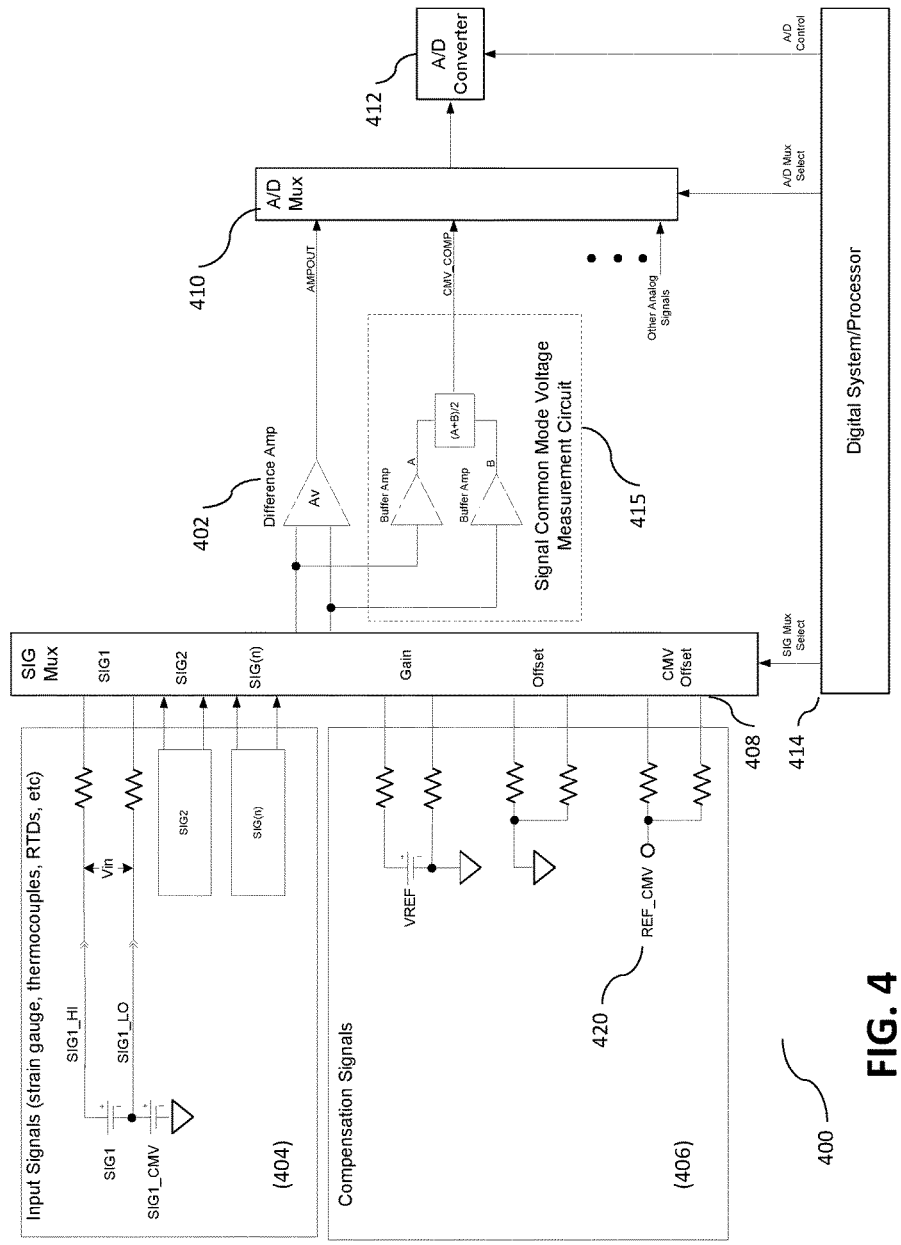
FIG. 4 depicts a differential input signal conditioner circuit in accordance with one or more embodiments of the present disclosure.

According to one or more embodiments, the system can be implemented with more specific circuit elements but is not limited. For example, FIG. 4 depicts a differential input signal conditioner circuit 400 in accordance with one or more embodiments of the present disclosure.

Specifically, the differential input signal circuit 400 includes input signals 404 that are provide to both a differential amplifier (Amp) 402 and a measurement circuit 415 through a signal multiplexer 408 based on a selection signal received from a controller 414, that can be called a digital system or processor 414. The outputs of both the differential amplifier (Amp) 402 and the measurement circuit 415 are provided to an A/D multiplexer that selects signals based on a second selection signal received from the controller 414. The combination of the A/D multiplexer, the A/D converter, and processing by the controller 414 are able to generate an output signal that can include a CMV compensated output based on the received outputs from the differential amplifier 402 and the measurement circuit 415. The received outputs can include one or more of a CMV error value, an amplified difference signal, a CMV compensation value, and a differential amplifier gain value.

Further, the input signals 404 include a differential input signal (SIG1). The SIG1 input includes the common mode voltage error (SIG1_CMV) as part of the signal which determining is the target of the circuit so that it can be compensated for to provide a more accurate output. The SIG1 signal is comprised of a high and low voltage signal (SIG1_HI) and SIG1_LO) which are subtracted from each other to provide the Vin value. The circuit also receives compensation signals 406. For example, compensation signals 406 can include a gain signal (VREF), an offset signal, and a CMV offset signal (REF_CMV) 420 in accordance with one or more embodiments. Further, according to other embodiments, a plurality of differential input signals can be provided.

All these signals are provided to a signal multiplexer 408 that receives a selection signal from a controller 414. The controller 414 can be an entire digital system, a processor, or anything there between. The signal multiplexer 408 then provides a selected signal to both the differential amplifier 402 and the measurement circuit 415. When the differential amplifier 402 receives a reference CMV signal from the signal multiplexer the differential amplifier outputs a CMV error value. When the differential amplifier 402 receives the differential input signal from the signal multiplexer the differential amplifier 402 outputs an amplified difference signal. When the measurement circuit 415 receives the reference CMV signal from the signal multiplexer the measurement circuit 415 outputs a confirmation value. When the measurement circuit 415 receives the differential input signal from the signal multiplexer the measurement circuit 415 output a CMV compensation value.

According to one or more embodiments, the measurement circuit can include a first buffer amplifier that receives a high impedance input, a second buffer amplifier that receives a low impedance input, and a value averaging circuit that averages the outputs from first buffer amplifier and the second buffer amplifier generating a compensation value. The high impedance input and the low impedance input are each part of an input signal such as the reference CMV signal or the differential input signal.

Further, after the signal passes through both elements (the differential amplifier 402 and the measurement circuit 415); the signals from each are provided to the A/D multiplexer 410, A/D converter 412, and digital system/processor 414. The signals from the differential amplifier 402 and the measurement circuit 415 are provided to the signal multiplexer 410 which receives a second selection signal from the controller 414. The signal multiplexer 410 selects a signal based on the second selection signal and provides the selected signal to the A/D converter 412 which processes the signal. The digital system/processor 414 can also process the signal further.

According to one or more embodiments, the differential signal conditioner and analog to digital conversion circuit 400 illustrated in FIG. 4 is used to measure and process external sensor input signals such as strain gauges, thermocouples, and RTDs. The signals are typically DC in nature and can have an unknown common mode voltage (SIG1_CMV in the block diagram). For example, a strain gauge input may have a 0-100 mV differential voltage input range and a common mode voltage that can range from 1 to 7 volts. A thermocouple input typically has a zero volt nominal common mode voltage input but could vary around zero by +/−5 volts or more depending on how the thermocouple is mounted (isolated or grounded) or if a short circuit fault is present.

According to one or more embodiments, two measurement elements can be added to the differential signal conditioning circuitry. The first is a common mode voltage calibration input (see CMV_OFFSET). The second additional measurement element is highlighted by the dotted lines and labelled "Signal Common Mode Measurement Circuit" 415, which can be called measurement circuit 415. Referencing the block diagram, a brief description of the process used to compensate for common mode voltage errors is provided.

Particularly, according to one or more embodiments, the compensation signals 406 are sequenced and selected by the processor 414 for correction of the gain and offset error sources due to the signal conditioning electronics.

The difference between the CMV_OFFSET and OFFSET signal is used to measure the signal conditioning and difference amplifier's DC CMRR error. A BIT range limit can be applied to the difference as a health check of the signal conditioner and amplifier CMRR.

The processor 414 selects and holds the input signal SIG (n) 404 and interleaves sampling of the AMPOUT and CMV_COMP signal. Multiple samples of both AMPOUT and CMV_COMP are converted and an average of each is computed by the processor 414. The averaged measurement of the AMPOUT signal is the gain amplified measurement of SIG (n) inclusive of all errors.

The averaged measurement of CMV_COMP is a measurement of the input signal common mode voltage, SIG (n)_CMV. A BIT range limit can be applied to the CMV-_COMP measurement to detect sensor and harness faults.

Using measurements above, a compensation algorithm is used to compensate out gain, offset, and the error due to the DC common mode voltage, SIG (n)_CMV.

Figure 5:
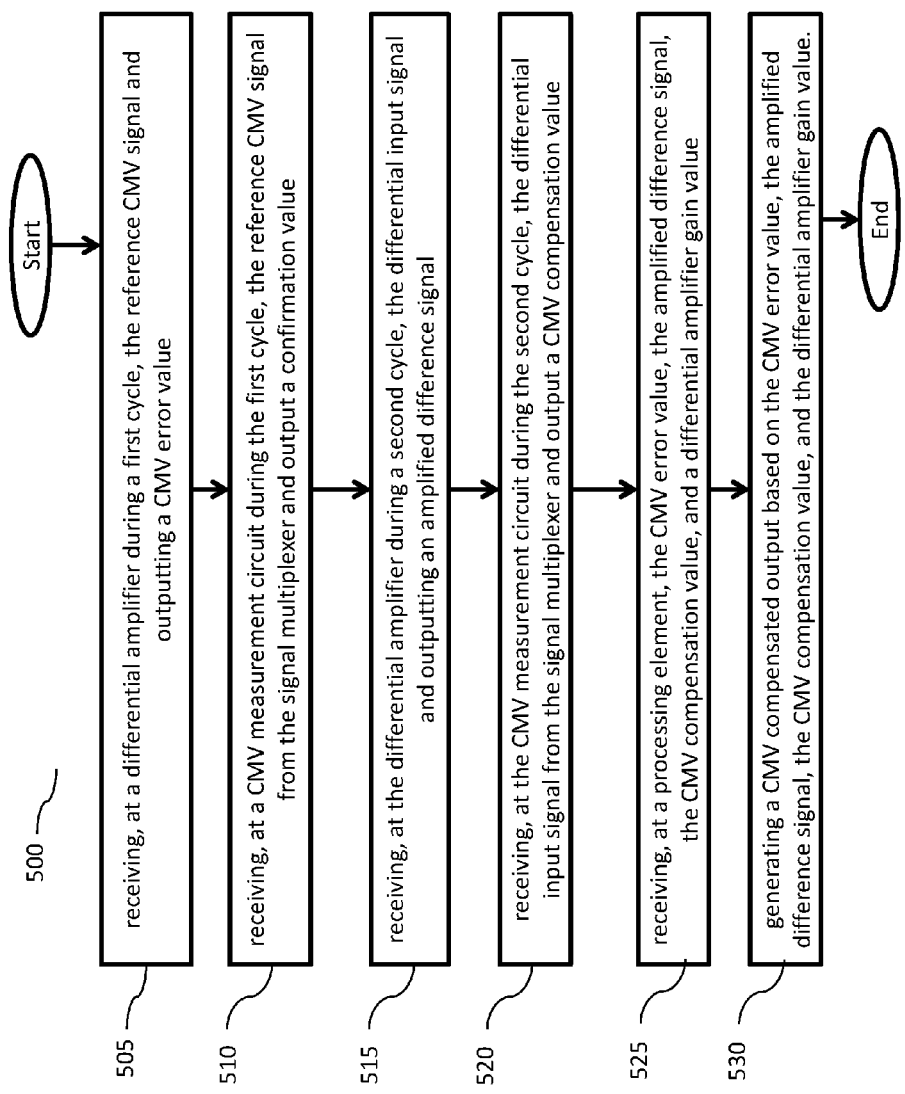
FIG. 5 depicts a flow chart of a method of implementing a differential input signal conditional circuit in accordance with one or more embodiments of the present disclosure.

FIG. 5 depicts a flow chart of a method 500 of implementing a differential input signal conditional circuit in accordance with one or more embodiments of the present disclosure. The method 500 includes receiving, at a differential amplifier during a first cycle, the reference CMV signal and outputting a CMV error value (operation 505). The method 500 also includes receiving, at a CMV measurement circuit during the first cycle, the reference CMV signal from the signal multiplexer and output a confirmation value (operation 510). The method 500 also includes receiving, at the differential amplifier during a second cycle, the differential input signal and outputting an amplified difference signal (operation 515). Further, the method 500 includes receiving, at the CMV measurement circuit during the second cycle, the differential input signal from the signal multiplexer and output a CMV compensation value (operation 520). The method 500 includes receiving, at a processing element, the CMV error value, the amplified difference signal, the CMV compensation value, and a differential amplifier gain value (operation 525). The method 500 also includes generating a CMV compensated output based on the CMV error value, the amplified difference signal, the CMV compensation value, and the differential amplifier gain value (operation 530).

According to one or more embodiments, the method 500 can also include receiving the differential input signal that comprises a high signal and a low signal and the reference CMV signal at a signal multiplexer, and transmitting one of the differential input and the reference CMV to the differential amplifier and the CMV measurement circuit based on a received selection signal from the processing element According to one or more embodiments, the method 500 can also include dividing the CMV error value by the differential amplifier gain value to produce a regulated CMV error value. The method 500 also includes multiplying the CMV compensation value with the regulated CMV error value to produce a compensation factor. Further the method 500 includes adding the compensation factor to the amplified difference signal to produce the CMV compensated output According to one or more embodiments, the method 500 can also include generating the CMV compensation value by averaging the high signal and the low signal of the differential input signal. The method 500 can further include receiving, at an A/D multiplexer, the amplified difference signal from the difference amplifier and the CMV compensation signal from the CMV measurement circuit. The method 500 also includes selecting, combining, and outputting one or more of the CMV error value, the amplified difference signal, the CMV compensation value, and the differential amplifier gain value using a digital system processor, and generating, sing an A/D converter, a digital representation of the CMV compensated output.

Further, the method 500 can further include additional operation according to one or more embodiments. Specifically, the method 500 includes receiving, at a first buffer amplifier, a high impedance input, receiving, at a second buffer amplifier, a low impedance input, and averaging, using a value averaging circuit, the outputs from first buffer amplifier and the second buffer amplifier generating a compensation value.

According to another embodiment, the method 500 includes receiving, at the signal multiplexer, a gain compensation signal and an offset compensation signal, correcting, using the gain compensation signal, for a gain error present in the difference amplifier, and correcting, using the offset compensation signal, for an offset error present in the difference amplifier. According to another embodiment, the method 500 includes receiving, at the signal multiplexer, a plurality of differential input signals.

Advantageously, embodiments described herein provide real-time compensation for an unknown DC common-mode voltage. Further, another benefit that can be provided by one or more embodiments a disclosed herein can include real-time compensation for the DC CMRR error term of the difference amplifier. Additionally, another benefit that can be included is CMRR error BIT range limit on difference amplifier based on expected healthy range. Further another benefit includes input signal common mode voltage BIT range limit and corresponding input fault detection.

Additionally, the circuit block diagram as shown in FIG. 4 and associated processing provides the following benefits over legacy differential input signal conditioners: Compensation for an unknown input signal DC common-mode voltage; Compensation for the DC CMRR error term of the signal conditioner; Real-time compensation for changes in the DC CMRR error term of the signal conditioner including amplifier CMRR error variation due to temperature; and Real-time compensation for changes in the signal DC common mode voltage during operation due to temperature or other environmental effects that may impact a sensor signal output.

In addition, according to other embodiments, the circuit and processing provides a system and method to measure and apply built-in-test (BIT) health checks on the input common mode voltage, SIG (n)_CMV. The additional benefits of the BIT features include the following: Built-In-Test (BIT) benefits such as CMRR error BIT range limit on signal conditioner/difference amplifier based on expected healthy CMRR range and Input signal common mode voltage BIT range limit based on expected healthy range. This is particularly useful if the common mode input voltage is approaching the capability of the signal conditioner. Also one or more embodiments can be useful to detect harnessing failures such as short circuits or degraded connections. The BIT feature can also include the benefit of fast detection of strain gauge sensor open input/harness faults when input common mode voltage drops below expected range.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions, combinations, sub-combinations, or equivalent arrangements not heretofore described, but which are commensurate with the scope of the present disclosure. Additionally, while various embodiments of the present disclosure have been described, it is to be understood that aspects of the present disclosure may include only some of the described embodiments.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description has been presented for purposes of illustration and description, but is not intended to be exhaustive or limited to the embodiments in the form disclosed. Many modifications and variations will be apparent to those of ordinary skill in the art without departing from the scope of the disclosure. The embodiments were chosen and described in order to best explain the principles of the disclosure and the practical application, and to enable others of ordinary skill in the art to understand various embodiments with various modifications as are suited to the particular use contemplated.

The present embodiments may be a system, a method, and/or a computer program product at any possible technical detail level of integration. The computer program product may include a computer readable storage medium (or media) having computer readable program instructions thereon for causing a processor to carry out aspects of the present disclosure.

The flowchart and block diagrams in the Figures illustrate the architecture, functionality, and operation of possible implementations of systems, methods, and computer program products according to various embodiments. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Accordingly, the present disclosure is not to be seen as limited by the foregoing description, but is only limited by the scope of the appended claims.

What is claimed is:

1. A differential signal conditioner circuit with common mode voltage (CMV) compensation, the differential signal conditioner circuit comprising:
   a signal multiplexer that receives a differential input signal that comprises a high signal and a low signal and a reference CMV signal;
   a differential amplifier coupled to the signal multiplexer that:
   receives the reference CMV signal from the signal multiplexer and outputs a CMV error value during a first cycle, and
   receives the differential input signal from the signal multiplexer and outputs an amplified difference signal during a second cycle;
   a CMV measurement circuit that:
   receives the reference CMV signal from the signal multiplexer and outputs a confirmation value during the first cycle; and
   receives the differential input signal from the signal multiplexer and outputs a CMV compensation value during the second cycle; and
   a processing element that receives the CMV error value, the amplified difference signal, the CMV compensation value, and a differential amplifier gain value and generates a CMV compensated output based on the CMV error value, the amplified difference signal, the CMV compensation value, and the differential amplifier gain value.

2. The differential signal conditioner circuit of claim 1, wherein the processing element generates the CMV compensated output by:
   dividing the CMV error value by the differential amplifier gain value to produce a scaled CMV error value;
   multiplying the CMV compensation value with the scaled CMV error value to produce a compensation factor; and
   adding the compensation factor to the amplified difference signal to produce the CMV compensated output.

3. The differential signal conditioner circuit of claim 1, wherein the CMV measurement circuit generates the CMV compensation value by averaging the high signal and the low signal of the differential input signal.

4. The differential signal conditioner circuit of claim 1, wherein the processing element comprises:
   an A/D multiplexer that receives the amplified difference signal from the difference amplifier and the CMV compensation signal from the CMV measurement circuit; and
   a digital system processor that selects, combines, and outputs one or more of the CMV error value, the amplified difference signal, the CMV compensation value, and the differential amplifier gain value; and
   an A/D converter that generates a digital representation of the CMV compensated output.

5. The differential signal conditioner circuit of claim 1, wherein the CMV measurement circuit comprises:
   a first buffer amplifier that receives a high signal output of the signal multiplexer;
   a second buffer amplifier that receives a low signal output of the signal multiplexer; and
   a value averaging circuit that averages the outputs from first buffer amplifier and the second buffer amplifier generating a compensation value.

6. The differential signal conditioner circuit of claim 5, wherein the compensation value is the CMV compensation value when the received high signal output of the signal multiplexer and low signal output of the signal multiplexer are part of the differential input signal.

7. The differential signal conditioner circuit of claim 5, wherein the compensation value is the confirmation value when the received high signal output of the signal multiplexer and low signal output of the signal multiplexer are portions the reference CMV.

8. The differential signal conditioner circuit of claim 1, wherein the signal multiplexer receives a gain compensation signal and an offset compensation signal;
   wherein the gain compensation signal corrects for a gain error present in the difference amplifier; and
   wherein the offset compensation signal corrects for an offset error present in the difference amplifier.

9. The differential signal conditioner circuit of claim 1, wherein the signal multiplexer receives a plurality of differential input signals.

10. A method for providing differential signal conditioning with common mode voltage compensation, the method comprising:
    receiving, at a differential amplifier during a first cycle, the reference CMV signal and outputting a CMV error value;
    receiving, at a CMV measurement circuit during the first cycle, the reference CMV signal from the signal multiplexer and outputting a confirmation value;
    receiving, at the differential amplifier during a second cycle, the differential input signal and outputting an amplified difference signal;

receiving, at the CMV measurement circuit during the second cycle, the differential input signal from the signal multiplexer and output a CMV compensation value;

receiving, at a processing element, the CMV error value, the amplified difference signal, the CMV compensation value, and a differential amplifier gain value; and generating a CMV compensated output based on the CMV error value, the amplified difference signal, the CMV compensation value, and the differential amplifier gain value.

11. The method of claim 10, further comprising:
receiving the differential input signal that comprises a high signal and a low signal and the reference CMV signal at a signal multiplexer; and
transmitting one of the differential input and the reference CMV to the differential amplifier and the CMV measurement circuit based on a received selection signal from the processing element.

12. The method of claim 10, wherein generating the CMV compensated output comprises:
dividing the CMV error value by the differential amplifier gain value to produce a scaled CMV error value;
multiplying the CMV compensation value with the scaled CMV error value to produce a compensation factor; and
adding the compensation factor to the amplified difference signal to produce the CMV compensated output.

13. The method of claim 10, further comprising:
generating the CMV compensation value by averaging the high signal and the low signal of the differential input signal.

14. The method of claim 10, further comprising:
receiving, at an A/D multiplexer, the amplified difference signal from the difference amplifier and the CMV compensation signal from the CMV measurement circuit;
selecting, combining, and outputting one or more of the CMV error value, the amplified difference signal, the CMV compensation value, and the differential amplifier gain value using a digital system processor; and
generating, sing an A/D converter, a digital representation of the CMV compensated output.

15. The method of claim 10, further comprising:
receiving, at a first buffer amplifier, a high signal output of the signal multiplexer;
receiving, at a second buffer amplifier, a low signal output of the signal multiplexer; and
averaging, using a value averaging circuit, the outputs from first buffer amplifier and the second buffer amplifier generating a compensation value.

16. The method of claim 10, further comprising:
receiving, at the signal multiplexer, a gain compensation signal and an offset compensation signal;
correcting, using the gain compensation signal, for a gain error present in the difference amplifier; and
correcting, using the offset compensation signal, for an offset error present in the difference amplifier.

17. The method of claim 10, further comprising:
receiving, at the signal multiplexer, a plurality of differential input signals.

18. A system for differential signal conditioning with common mode voltage compensation, the system comprising:
a differential amplifier device that receives a reference CMV signal and outputs a CMV error value during a first cycle, and receives a differential input signal and outputs an amplified difference signal during a second cycle;
a measurement device that receives the reference CMV signal and outputs a confirmation value during the first cycle, and receives the differential input signal, and outputs a CMV compensation value during the second cycle; and
a processing element that receives the CMV error value, the amplified difference signal, the CMV compensation value, and a differential amplifier gain value, and generates a CMV compensated output based on the CMV error value, the amplified difference signal, the CMV compensation value, and the differential amplifier gain value.

19. The system of claim 18, wherein the processing element generates the CMV compensated output by:
dividing the CMV error value by the differential amplifier gain value to produce a scaled CMV error value;
multiplying the CMV compensation value with the scaled CMV error value to produce a compensation factor; and
adding the compensation factor to the amplified difference signal to produce the CMV compensated output.

20. The system of claim 18, wherein the CMV measurement device comprises:
a first buffer amplifier that receives a high signal output of the signal multiplexer;
a second buffer amplifier that receives a low signal output of the signal multiplexer; and
a value averaging circuit that averages the outputs from first buffer amplifier and the second buffer amplifier generating a compensation value,
wherein, during a first cycle, the compensation value is the confirmation value when the received high signal output of the signal multiplexer and low signal output of the signal multiplexer are portions the reference CMV, and
wherein, during a second cycle, the compensation value is the CMV compensation value when the received high signal output of the signal multiplexer and low signal output of the signal multiplexer are part of the differential input signal.

* * * * *